(12) United States Patent
Thamaran

(10) Patent No.: US 6,574,158 B1
(45) Date of Patent: Jun. 3, 2003

(54) METHOD AND SYSTEM FOR MEASURING THRESHOLD OF EPROM CELLS

(75) Inventor: Sunil Thamaran, Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/963,572

(22) Filed: Sep. 27, 2001

(51) Int. Cl.[7] ............................................. G11C 29/00
(52) U.S. Cl. .............. 365/201; 365/185.24; 365/185.14
(58) Field of Search ...................... 365/201, 185.24, 365/185.14, 185.29, 189.01, 189.09

(56) References Cited

U.S. PATENT DOCUMENTS

| | | |
|---|---|---|
| 4,253,059 A | 2/1981 | Bell et al. |
| 4,612,630 A | 9/1986 | Rosier |
| 4,809,231 A * | 2/1989 | Shannon et al. ............. 365/201 |
| 4,870,618 A | 9/1989 | Iwashita |
| 5,016,215 A | 5/1991 | Tigelaar |
| 5,301,150 A | 4/1994 | Sullivan et al. |
| 5,303,185 A | 4/1994 | Hazani |
| 5,579,262 A | 11/1996 | Song |
| 5,590,076 A | 12/1996 | Haddad et al. |
| 5,654,925 A * | 8/1997 | Koh et al. ............. 365/185.11 |
| 5,659,514 A | 8/1997 | Hazani |
| 5,748,533 A | 5/1998 | Dunlap et al. |
| 5,754,475 A | 5/1998 | Bill et al. |
| 5,761,125 A | 6/1998 | Himeno |
| 5,815,445 A | 9/1998 | Hull et al. |
| 5,821,799 A | 10/1998 | Saripella |
| 5,923,590 A | 7/1999 | Yero |
| 5,941,987 A | 8/1999 | Davis |
| 5,956,269 A | 9/1999 | Ouyang et al. |
| 5,978,278 A | 11/1999 | Lee |
| 6,005,810 A | 12/1999 | Wu |
| 6,011,725 A | 1/2000 | Eitan |
| 6,122,205 A | 9/2000 | Yach |

* cited by examiner

Primary Examiner—David Lam
(74) Attorney, Agent, or Firm—Ditthavong & Carlson, P.C.

(57) ABSTRACT

An approach for testing an erasable programmable read-only memory (EPROM) cell for a threshold voltage is provided. A voltage lower than a source voltage that is associated with a read operation is applied to the gate of the EPROM cell. A signal is read out from the EPROM cell when the voltage is applied to the EPROM cell. The signal is used to calculate the threshold voltage of the EPROM cell.

20 Claims, 4 Drawing Sheets

METHOD AND SYSTEM FOR MEASURING THRESHOLD OF EPROM CELLS

FIELD OF THE INVENTION

The present invention relates to memory devices, and more particularly to erasable programmable read-only memory.

BACKGROUND OF THE INVENTION

An Erasable Programmable Read-Only Memory (EPROM) provides a convenient approach for non-volatile storage of information. The competitive EPROM market continually poses a challenge for memory manufacturers to produce these solid-state memories cost-effectively. During testing of the EPROMs, a capability of reading out threshold voltages of unprogrammed or erased EPROM cells is needed to improve yield.

With conventional EPROMs, the threshold voltages may not be precisely measured. That is, only an estimate of whether the threshold is below a source voltage (VDD) can be made. Actual voltages cannot be measured economically. Specifically, because the unprogrammed thresholds are very low (for example, 0.9 v to 1.1 v), the associated read circuits, which operate at higher normal operating voltages (e.g., 3.3 v or 5.0 v), are not read such low threshold voltages. For example, voltage thresholds are on the order of 1.0 v. To read such low voltage values, the read circuit would be required to operate at 1.0 v. Therefore, there is an inability to verify whether an EPROM is erased completely or partially.

Traditionally, complex circuitry is added in the memory device to read the threshold voltages. A number of drawbacks attend such an approach. The additional complexity translates into higher manufacturing costs. Also, the added circuitry may require increased power consumption.

Therefore, there is a need for a simplified approach to measuring EPROM thresholds. There is also a need to improve yield of the EPROMs in a cost-effective manner.

SUMMARY OF THE INVENTION

These and other needs are addressed by the present invention in which an approach is provided to test an erasable programmable read-only memory (EPROM) cell for a threshold voltage. A circuit applies a voltage that is lower (in magnitude) than a source voltage associated with a read operation to drive the EPROM cell. For example, the voltage is in the range of about 0.9 v to about 1.1 v, while the source voltage is about 3.3 v or 5.0 v. A read logic operates using this source voltage. Under a normal read operation, a switch, which is coupled to the EPROM cell, drives the EPROM cell according to the source voltage. In a threshold read operation, the switch is disabled to permit a different voltage to be applied to the gate of the EPROM cell. In this manner, the source voltage is prevented from being applied to the gate. The circuit, which may be a potential divider circuit or a fixed difference circuit, generates the voltage to represent, respectively, a fixed ratio of the source voltage or a fixed difference with the source voltage. A signal from the EPROM cell is readout when the voltage is applied to the EPROM cell to calculate the threshold voltage. Under this arrangement, the threshold voltage of unprogrammed or erased EPROM cell can be determined accurately without complex circuitry.

According to one aspect of the present invention, a method for testing an EPROM cell for a threshold voltage is disclosed. The method includes applying a voltage lower than another voltage that is associated with a read operation to drive the EPROM cell. The method also includes reading out a signal from the EPROM cell when the voltage is applied to the EPROM cell.

According to another aspect of the present invention, a memory device is disclosed. The device includes an EPROM cell having a gate. The device also includes a circuit that is coupled to the gate of the EPROM cell and is configured to generate a voltage lower than another voltage associated with a read operation. A signal is readout from the EPROM cell when the voltage is applied to the EPROM cell.

In yet another aspect of the present invention, a memory device is disclosed. The device includes an EPROM cell. Additionally, the device includes means for applying a voltage lower than another voltage associated with a read operation to drive the EPROM cell. A signal from the EPROM cell is readout when the voltage is applied to the EPROM cell.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

An approach for measuring voltage thresholds of unprogrammed or erased EPROM cells are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
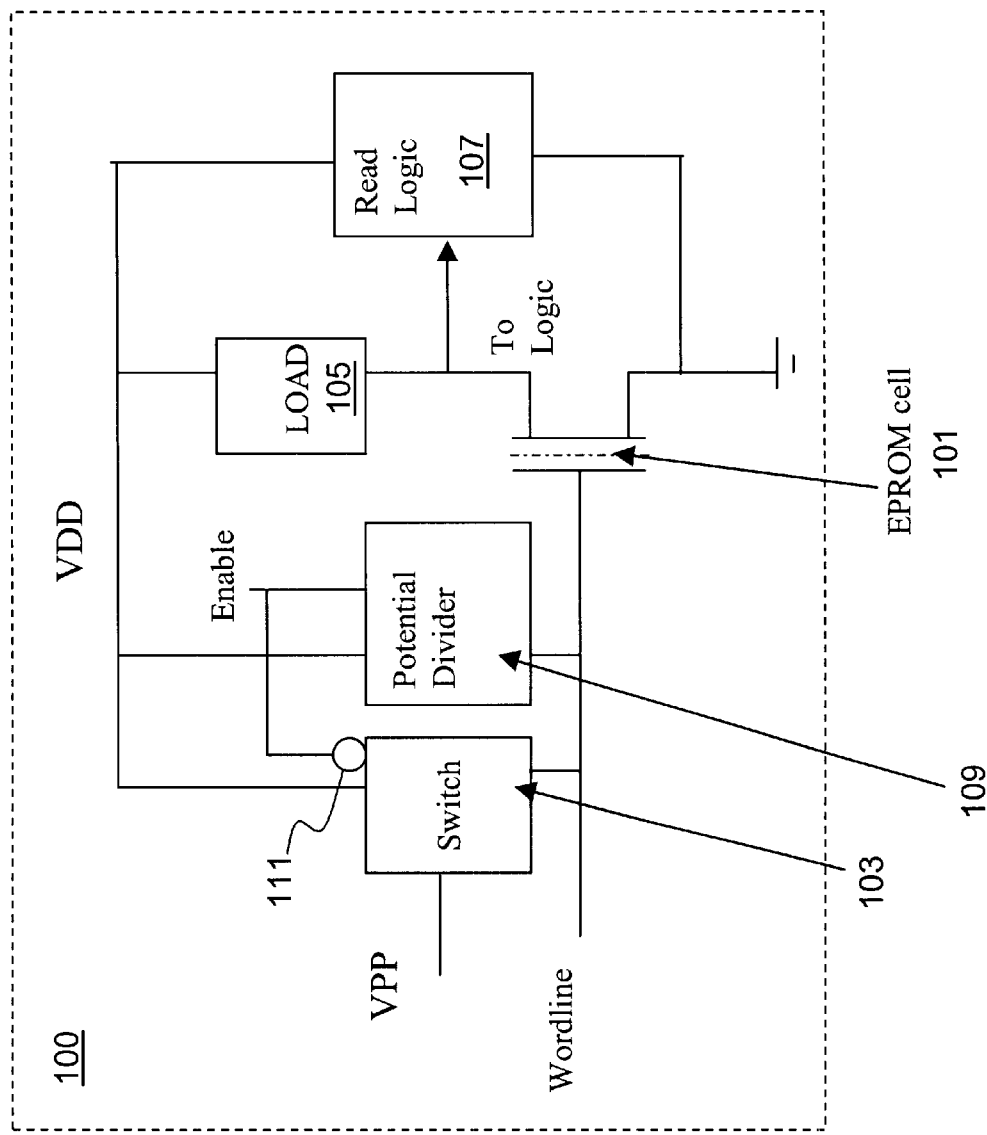
FIG. 1 is a diagram of a memory device having circuitry that permits calculation of memory threshold voltages, according to an embodiment of the present invention.

FIG. 1 is a diagram of a memory device having circuitry that permits calculation of memory threshold voltages, according to an embodiment of the present invention. It is recognized that many electronic devices enter a one-time programmable market. If a determination can be accurately made whether the EPROM is completely erased before packaging, improvement in the yield can be achieved. This determination requires that the EPROM thresholds be measured accurately at an early stage in the manufacturing process, such as during testing (sorting).

As used herein, the term EPROM may refer to any one of the following types of EPROMs: Ultraviolet (UV) PROM, Electrically Alterable ROM (EAPROM), and Electrically Erasable ROM (EEPROM). Each of these types of EPROM employs different technologies; the choice of the particular EPROM depends on the application. The UV PROM has a quartz window on the chip to permit exposure of high-intensity ultraviolet light to erase the memory cells. The EAPROM utilizes a metal-nitride-oxide semiconductor (MNOS), in which a high gate voltage is applied to achieve charge tunneling. The EEPROM eliminates the use of UV light as a technique for erasure, and permits erasure of all or portions of the cells through local application of an electric field.

A memory device 100 includes an array of memory cells (i.e., EPROM cell 101), of which only one is shown. As seen in FIG. 1, the EPROM cell 101 that has a gate coupled to a switch 103. The switch 103 toggles between two source voltages: VDD and VPP. During programming, the switch 103 presents VPP (which is in the order of 12.0 v) to the wordline of the EPROM cell 101. Under read operation, the switch 103 outputs VDD (e.g., 3.3 v or 5 v) to the wordline. During the read operation, if the EPROM cell 101 conducts (i.e., is ON), this indicates that the threshold voltage of the EPROM cell 101 is less than VDD.

As shown in FIG. 1, VDD powers a load 105 and read logic 107, which includes standard circuitry. Consequently, the minimum VDD that can be applied depends on what constitutes a reliable operating voltage for the specific memory technology.

A circuit 109 is introduced in the memory device 100 to generate a voltage that is a function of VDD. The circuit 109, in an exemplary embodiment, is a potential divider; this potential divider circuit is further described with respect to FIG. 3. Alternatively, the circuit 109 may be implemented as a VDD-fixed difference circuit to drive the gate of the EPROM cell 101 with a voltage having a fixed difference from VDD.

For the purposes of explanation, the operation of the memory device 100 is described with the circuit 109 as a potential divider. The potential divider circuit 109 drives the gate of the EPROM cell 101 to a ratio of VDD; this ratio can be determined according to threshold values of the specific technology.

The circuit 109 is enabled by logic (not shown) in, for example, a threshold read mode. The logic outputs a control signal (i.e., ENABLE signal) to the circuit 109 and to an inverter 111 that is coupled to the switch 103. Accordingly, in the threshold read mode, the output of the switch 103 is disabled, such that the source voltage of VDD does not drive the gate of the EPROM cell 101. In other words, when threshold read mode is selected through the enable signal, the circuit 109 is enabled and the switch 103 is disabled from driving the wordline. The gate of the EPROM cell 101, thus, is clamped to a fixed ratio (or fixed difference) voltage that is based on the value of VDD.

Under the threshold read mode, if the voltage that is input to the wordline crosses the threshold associated with the EPROM cell 101, then the EPROM cell 101 conducts and pulls the output to logic LOW. This voltage is a direct function of VDD, and hence, from the value of VDD at which the output is pulled LOW, the threshold voltage can be calculated, very accurately.

By contrast, under the conventional approach, the thresholds of the order of 1 v, if lowest operating voltage is 2.5 v cannot be determined. This conventional approach would require a read circuit to operate at 1.0 v, and therefore, the approach cannot determine whether the EPROM cell is erased completely or just marginally. As mentioned, the inability to accurately determine EPROM thresholds may lead to wrong EPROM read margin.

Figure 2:
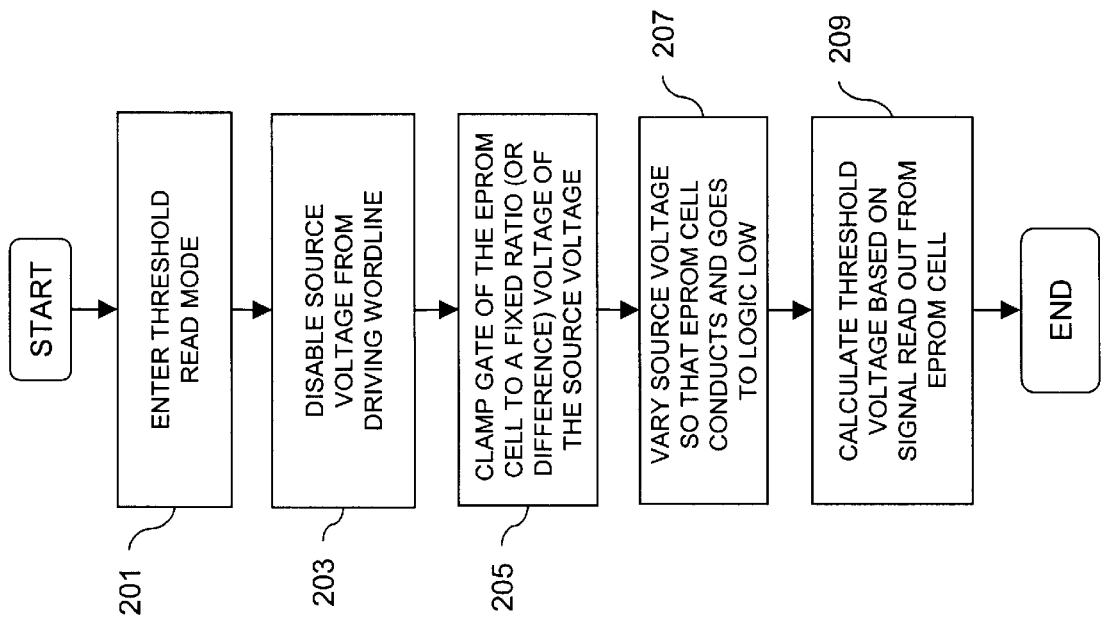
FIG. 2 is a flowchart of an approach for determining the threshold voltage of an Erasable Programmable Read-Only Memory (EPROM), according to an embodiment of the present invention.
Figure 3:
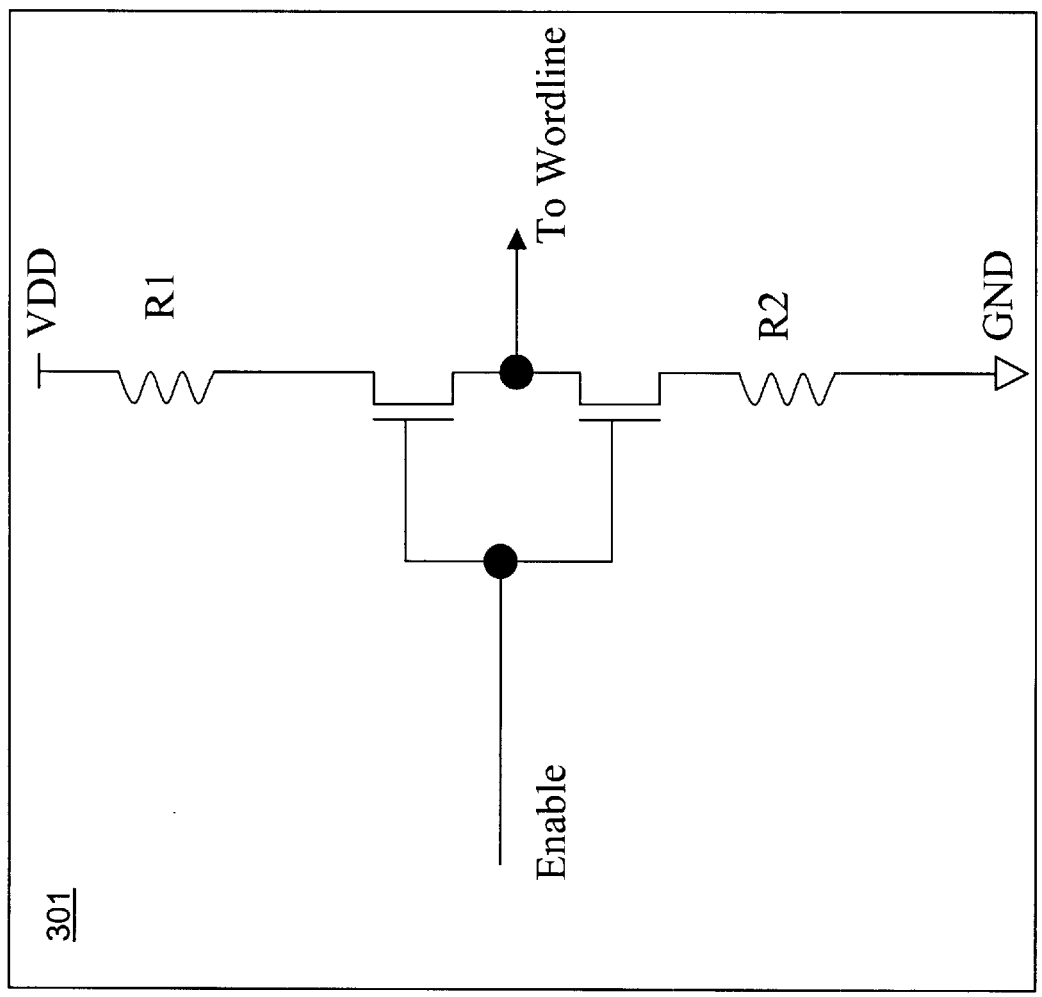
FIG. 3 is a diagram of an exemplary potential divider circuit utilized in the memory device of FIG. 1.

FIG. 2 is a flowchart of an approach for determining the threshold voltage of an Erasable Programmable Read-Only Memory (EPROM), according to an embodiment of the present invention. In step 201, an ENABLE signal is input into the potential divider circuit 109 to place the memory device in a threshold read mode. The voltage output from the switch 103 is disabled, per step 203, while the circuit 109 outputs a voltage that is based on VDD to the wordline. Next, the gate of the EPROM cell, as in step 205, is clamped to the output voltage of the circuit 109; this output voltage is a fixed ratio voltage (as shown in FIG. 3) of the source voltage, VDD. Alternatively, this output voltage may be a fixed difference from VDD. In step 207, the source voltage is varied so that the EPROM conducts, thereby permitting calculation of the threshold voltage (step 209).

FIG. 3 is a diagram of an exemplary potential divider circuit utilized in the memory device of FIG. 1. A potential divider circuit 301 includes two resistors, R1 and R2, whose values are set depending on the fixed ratio that is desired.

The above approach possesses numerous advantages over conventional approaches. For example, the read operation of a memory device is not impacted. Specifically, low voltage thresholds may be measured without operating at low VDD. The accuracy of the measurement of the threshold voltages is high because of the use of a fixed ratio (assuming if a potential divider is used). Thus, exact values of threshold voltages can be measured, without introducing expensive, complex circuitry. The memory device 101 also minimizes power consumption.

Further, the above arrangement provides a number of manufacturing advantages. For one-time programmable devices, it can be ensured that the EPROM is completely erased (or unprogrammed) before packaging, resulting in improved yield over the conventional design.

Also, by bringing out the wordline of the memory device 100 to a test PAD, such that the threshold voltages (in threshold read mode) and programming voltages (in programming mode) can be determined, without utilizing an additional pin for measuring programming voltages at the wordline. If the wordline is brought to a test PAD on the die, the PAD may be used to monitor voltage on wordline during various modes of operation of the memory device 100. The voltage measurement itself can be accomplished using standard techniques.

For example, if a tester has the capability of measuring voltages, such a tester can be used. If the tester does not have that capability, then a window comparator can be designed on the sort board. A window comparator output will be at one logic state when input voltage is within a certain range. When the voltage is outside that range, the output will be in the other logic state. As a result, it can be determined whether the voltage is within the expected range. For example, if the window comparator is designed to detect voltages within 0.9 v to 1.1 v, then by examining the voltage at the logic state, it can be guaranteed that the voltage is within that range.

Figure 4:
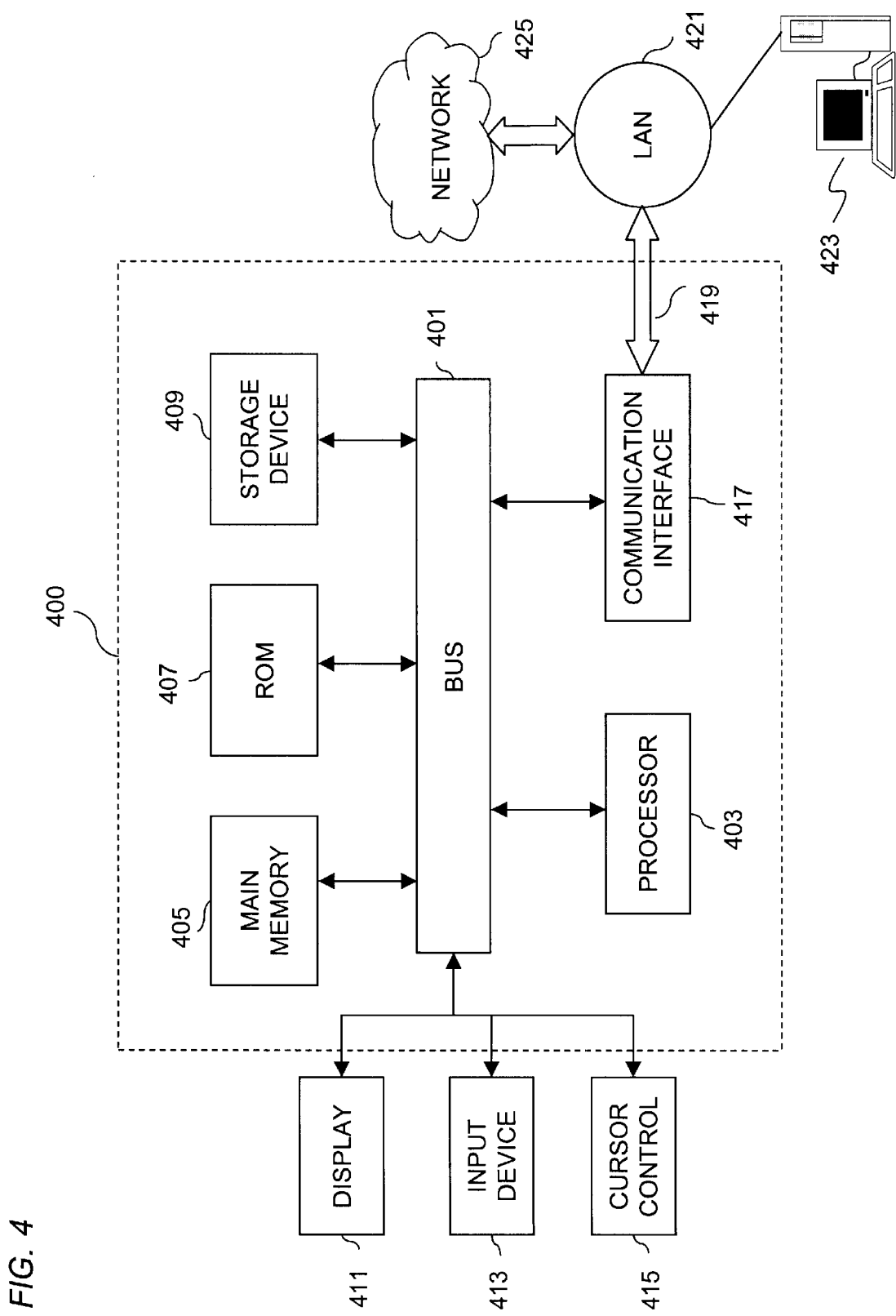
FIG. 4 is a diagram of a computer system that can be used to implement an embodiment of the present invention.

FIG. 4 illustrates a computer system upon which an embodiment according to the present invention can be implemented. In particular, the testing procedure of the EPROM can be executed by the computer system 400. The computer system 400 includes a bus 401 or other communication mechanism for communicating information, and a processor 403 coupled to the bus 401 for processing information. The computer system 400 also includes main memory 405, such as a random access memory (RAM) or other dynamic storage device, coupled to the bus 401 for storing information and instructions to be executed by the processor 403. Main memory 405 can also be used for storing temporary variables or other intermediate information during execution of instructions to be executed by the processor 403. The computer system 400 further includes a read only memory (ROM) 407 or other static storage device coupled to the bus 401 for storing static information and instructions for the processor 403. A storage device 409, such as a magnetic disk or optical disk, is additionally coupled to the bus 401 for storing information and instructions.

The computer system 400 may be coupled via the bus 401 to a display 411, such as a cathode ray tube (CRT), liquid crystal display, active matrix display, or plasma display, for displaying information to a computer user. An input device 413, such as a keyboard including alphanumeric and other keys, is coupled to the bus 401 for communicating information and command selections to the processor 403. Another type of user input device is cursor control 415, such as a mouse, a trackball, or cursor direction keys for communicating direction information and command selections to the processor 403 and for controlling cursor movement on the display 411.

According to one embodiment of the invention, the voltage threshold calculation (or programming voltage calculation) of the process of FIG. 2 is provided by the computer system 400 in response to the processor 403 executing an arrangement of instructions contained in main memory 405. Such instructions can be read into main memory 405 from another computer-readable medium, such as the storage device 409. Execution of the arrangement of instructions contained in main memory 405 causes the processor 403 to perform the process steps described herein. One or more processors in a multi-processing arrangement may also be employed to execute the instructions contained in main memory 405. In alternative embodiments, hardwired circuitry may be used in place of or in combination with software instructions to implement the embodiment of the present invention. Thus, embodiments of the present invention are not limited to any specific combination of hardware circuitry and software.

The computer system 400 also includes a communication interface 417 coupled to bus 401. The communication interface 417 provides a two-way data communication coupling to a network link 419 connected to a local network 421. For example, the communication interface 417 may be a digital subscriber line (DSL) card or modem, an integrated services digital network (ISDN) card, a cable modem, or a telephone modem to provide a data communication connection to a corresponding type of telephone line. As another example, communication interface 417 may be a local area network (LAN) card (e.g. for Ethernet™ or an Asynchronous Transfer Model (ATM) network) to provide a data communication connection to a compatible LAN. Wireless links can also be implemented. In any such implementation, communication interface 417 sends and receives electrical, electromagnetic, or optical signals that carry digital data streams representing various types of information. Further, the communication interface 417 can include peripheral interface devices, such as a Universal Serial Bus (USB) interface, a PCMCIA (Personal Computer Memory Card International Association) interface, etc.

The network link 419 typically provides data communication through one or more networks to other data devices. For example, the network link 419 may provide a connection through local network 421 to a host computer 423, which has connectivity to a network 425 (e.g. a wide area network (WAN) or the global packet data communication network now commonly referred to as the "Internet") or to data equipment operated by service provider. The local network 421 and network 425 both use electrical, electromagnetic, or optical signals to convey information and instructions. The signals through the various networks and the signals on network link 419 and through communication interface 417, which communicate digital data with computer system 400, are exemplary forms of carrier waves bearing the information and instructions.

The computer system 400 can send messages and receive data, including program code, through the network(s), network link 419, and communication interface 417. In the Internet example, a server (not shown) might transmit requested code belonging an application program for implementing an embodiment of the present invention through the network 425, local network 421 and communication interface 417. The processor 404 may execute the transmitted code while being received and/or store the code in storage device 49, or other non-volatile storage for later execution. In this manner, computer system 400 may obtain application code in the form of a carrier wave.

The term "computer-readable medium" as used herein refers to any medium that participates in providing instructions to the processor 404 for execution. Such a medium may take many forms, including but not limited to non-volatile media, volatile media, and transmission media. Non-volatile media include, for example, optical or magnetic disks, such as storage device 409. Volatile media include dynamic memory, such as main memory 405. Transmission media include coaxial cables, copper wire and fiber optics, including the wires that comprise bus 401. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a Compact Disc-Read Only Memory (CD-ROM), Compact Disc Re-Writable (CDRW), Digital Video Disc (DVD), any other optical medium, punch cards, paper tape, optical mark sheets, any other physical medium with patterns of holes or other optically recognizable indicia, a Random Access Memory (RAM), a programmable Read-Only Memory (PROM), and Erasable Programmable Read-Only Memory (EPROM), a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Accordingly, the present invention provides a circuit, which according to one embodiment is a potential divider circuit, to apply a voltage that is based on a source voltage (VDD) to the gate of an EPROM cell. Under read operation, the source voltage can be used to operate the read logic coupled to the EPROM cell. When enabled according to a threshold read mode, the circuit drives the gate of the EPROM cell, such that the voltage threshold can be calculated.

While the present invention has been described in connection with a number of embodiments and implementations, the present invention is not so limited but covers various obvious modifications and equivalent arrangements, which fall within the purview of the appended claims.

What is claimed is:

1. A method for testing an erasable programmable read-only memory (EPROM) cell for a threshold voltage, the method comprising:
    applying a voltage lower than a voltage associated with a read operation to drive the EPROM cell, wherein the voltage is a fixed ratio of the voltage associated with the read operation; and
    reading out a signal from the EPROM cell when the voltage is applied to the EPROM cell.

2. The method according to claim 1, further comprising:
    disabling the voltage associated with the read operation from driving the EPROM cell during the applying step.

3. The method according to claim 1, further comprising:
    applying the voltage associated with the read operation to read logic coupled to the EPROM cell.

4. The method according to claim 1, wherein the voltage is based on the voltage associated with the read operation, the method further comprising:
    varying the voltage associated with the read operation to conduct the EPROM cell; and
    calculating the threshold voltage based on the read out signal.

5. The method according to claim 1, wherein the applying step is performed in response to a signal for enabling the generation of the voltage.

6. The method according to claim 1, wherein the applying step is performed during sort.

7. A method for testing an erasable programmable read-only memory (EPROM) cell for a threshold voltage, the method comprising:
    applying a voltage lower than a voltage associated with a read operation to drive the EPROM cell, wherein the voltage is a fixed difference with the voltage associated with the read operation; and
    reading out a signal from the EPROM cell when the voltage is applied to the EPROM cell.

8. A memory device comprising:
    an erasable programmable read-only memory (EPROM) cell having a gate; and
    a circuit coupled to the gate of the EPROM cell and configured to generate a voltage lower than a voltage associated with a read operation, wherein a signal is readout from the EPROM cell when the voltage is applied to the EPROM cell, and the voltage is a fixed ratio of the voltage associated with the read operation.

9. The device according to claim 8, further comprising:
    a switch coupled to the EPROM cell and configured to drive the EPROM cell according to the voltage associated with the read operation, the switch being disabled to permit the voltage to be applied to the EPROM cell; and
    read logic coupled to the EPROM cell and configured to operate according to the voltage associated with the read operation.

10. The device according to claim 8, wherein the voltage is based on the voltage associated with the read operation, and the voltage associated with the read operation is varied to conduct the EPROM cell, the signal being read out to calculate a threshold voltage of the EPROM cell.

11. The device according to claim 8, further comprising:
    another EPROM cell coupled to the circuit.

12. A memory device comprising:
    an erasable programmable read-only memory (EPROM) cell having a gate;
    a circuit coupled to the gate of the EPROM cell and configured to generate a voltage lower than a voltage associated with a read operation, wherein a signal is readout from the EPROM cell when the voltage is applied to the EPROM cell;
    a switch coupled to the EPROM cell and configured to drive the EPROM cell according to the voltage associated with the read operation, the switch being disabled to permit the voltage to be applied to the EPROM cell;
    read logic coupled to the EPROM cell and configured to operate according to the voltage associated with the read operation; and
    an inverter coupled to the switch and configured to receive a signal to enable the generation of the voltage.

13. A memory device comprising:
    an erasable programmable read-only memory (EPROM) cell having a gate; and
    a circuit coupled to the gate of the EPROM cell and configured to generate a voltage lower than a voltage associated with a read operation, wherein a signal is readout from the EPROM cell when the voltage is applied to the EPROM cell, and the voltage is a fixed difference with the voltage associated with the read operation.

14. A memory device comprising:
    an EPROM cell; and
    means for applying a voltage lower than a voltage associated with a read operation to drive the EPROM cell, wherein a signal from the EPROM cell is readout when the voltage is applied to the EPROM cell, and the means for applying includes a potential divider.

15. The device according to claim 14, further comprising:
    a switch coupled to the EPROM cell and configured to drive the EPROM cell according to the voltage associated with the read operation, the switch being disabled to permit the voltage to be applied to the EPROM cell; and
    read logic coupled to the EPROM cell and configured to operate according to the voltage associated with the read operation.

16. The device according to claim 15, further comprising:
    an inverter coupled to the switch and configured to receive a signal to enable the generation of the voltage.

17. The device according to claim 14, wherein the voltage is based on the voltage associated with the read operation, and the voltage associated with the read operation is varied to conduct the EPROM cell, the signal being read out to calculate a threshold voltage of the EPROM cell.

18. The device according to claim 14, further comprising:

another EPROM cell coupled to the means for applying.

19. The device according to claim 14, wherein the EPROM cell is in at least one of an unprogrammed state, and an erased state.

20. A memory device comprising:

an EPROM cell; and means for applying a voltage lower than a voltage associated with a read operation to drive the EPROM cell, wherein a signal from the EPROM cell is readout when the voltage is applied to the EPROM cell, and the means for applying includes a fixed difference circuit.

\* \* \* \* \*